(12) United States Patent
Abys et al.

(10) Patent No.: US 6,274,254 B1
(45) Date of Patent: Aug. 14, 2001

(54) ELECTRODEPOSITED PRECIOUS METAL FINISHES HAVING WEAR RESISTANT PARTICLES THEREIN

(75) Inventors: Joseph Anthony Abys, Township of Warren, Somerset County; Conor Anthony Dullaghan, Township of Woodbridge, Middlesex County; Chonglun Fan, Township of Bridgewater, Somerset County; Brian Thomas Smith, Borough of Somerville, Somerset County, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/379,553

(22) Filed: Aug. 23, 1999

(51) Int. Cl.[7] .......................... C25D 15/00; H01R 13/03; B32B 5/00; B32B 15/01
(52) U.S. Cl. ..................... 428/670; 428/672; 428/929; 428/935; 439/886; 205/109; 205/176; 205/257
(58) Field of Search ..................... 428/670, 672, 428/673, 935, 929; 205/109, 176, 257; 439/886

(56) References Cited

U.S. PATENT DOCUMENTS

| | | | |
|---|---|---|---|
| 3,620,839 | 11/1971 | Geckle et al. | 117/226 |
| 4,098,654 | * 7/1978 | Helle et al. | 204/16 |
| 4,830,889 | 5/1989 | Henry et al. | |
| 5,028,492 | * 7/1991 | Guenin | 428/614 |
| 5,103,637 | 4/1992 | Itoh et al. | |
| 5,124,007 | 6/1992 | Tsuchiya et al. | |
| 5,141,702 | 8/1992 | Guenin et al. | 419/8 |
| 5,199,553 | * 4/1993 | Shinohara et al. | 200/265 |
| 5,667,659 | * 9/1997 | Souza et al. | 205/109 |
| 5,721,055 | 2/1998 | Feldstein. | |
| 5,853,557 | * 12/1998 | Souza et al. | 205/109 |
| 5,916,695 | * 6/1999 | Fister et al. | 428/647 |
| 5,967,860 | * 10/1999 | Ricketts et al. | 439/886 |
| 5,973,405 | * 10/1999 | Keukelaar et al. | 257/780 |

FOREIGN PATENT DOCUMENTS

| | | |
|---|---|---|
| 57-85999 | * 5/1982 | (JP) . |
| 59-23835 | * 2/1984 | (JP) . |
| 59-107007 | * 6/1984 | (JP) . |
| 59-150098 | * 8/1984 | (JP) . |
| 59-150099 | * 8/1984 | (JP) . |

OTHER PUBLICATIONS

J.A. Abys et al., "Palladium–Cobalt Makes a Superior Finish", Connector Specifier, p. 12 etc., Feb. 1999.

\* cited by examiner

Primary Examiner—John J. Zimmerman
(74) Attorney, Agent, or Firm—Lowenstein Sandler PC

(57) ABSTRACT

An electrical connector comprises connector contacts having a metal base and a surface finish layer over the base, the surface finish layer being a composite of an electroplated precious metal composition and wear resistant particles dispersed therein. In the preferred embodiment, the precious metal layer is a PdCo alloy and the wear resistant particles are sub-micron sized lubricating particles, e.g. polytetrafluoroethylene particles and a flash coat of gold is provided over the composite layer.

15 Claims, 4 Drawing Sheets

SAMPLE FOR SLIDING WEAR TEST 0.1 μm Au 1.0 μm Pd-Co*

2.5 μm Ni

Cu SUBSTRATE

\* CO-DEPOSITED WITH WEAR RESISTANT PARTICLES

FIG. 3

| SLIDING WEAR – COEFFICIENT OF FRICTION vs. WEAR CYCLE | | | | | | | | |
|---|---|---|---|---|---|---|---|---|
| GOLD AND GOLD-FLASHED (GF) FINISHES | | | | | | | | |
| LOAD: 100 GRAMS | | | | | | | | |
| WEAR CYCLE | 1 | 100 | 250 | 500 | 1000 | 5000 | 10000 | |
| HARD Au | 0.23 | 0.26 | 0.27 | 0.34 | 0.47 | 0.52 | 0.60 | |
| GFPdNi | 0.39 | 0.46 | 0.47 | 0.48 | 0.53 | 0.53 | 0.55 | |
| GFPdCo | 0.33 | 0.39 | 0.38 | 0.45 | 0.43 | 0.57 | 0.43 | |
| GFPdCo w PTFE | 0.12 | 0.12 | 0.12 | 0.14 | 0.16 | 0.17 | 0.28 | |

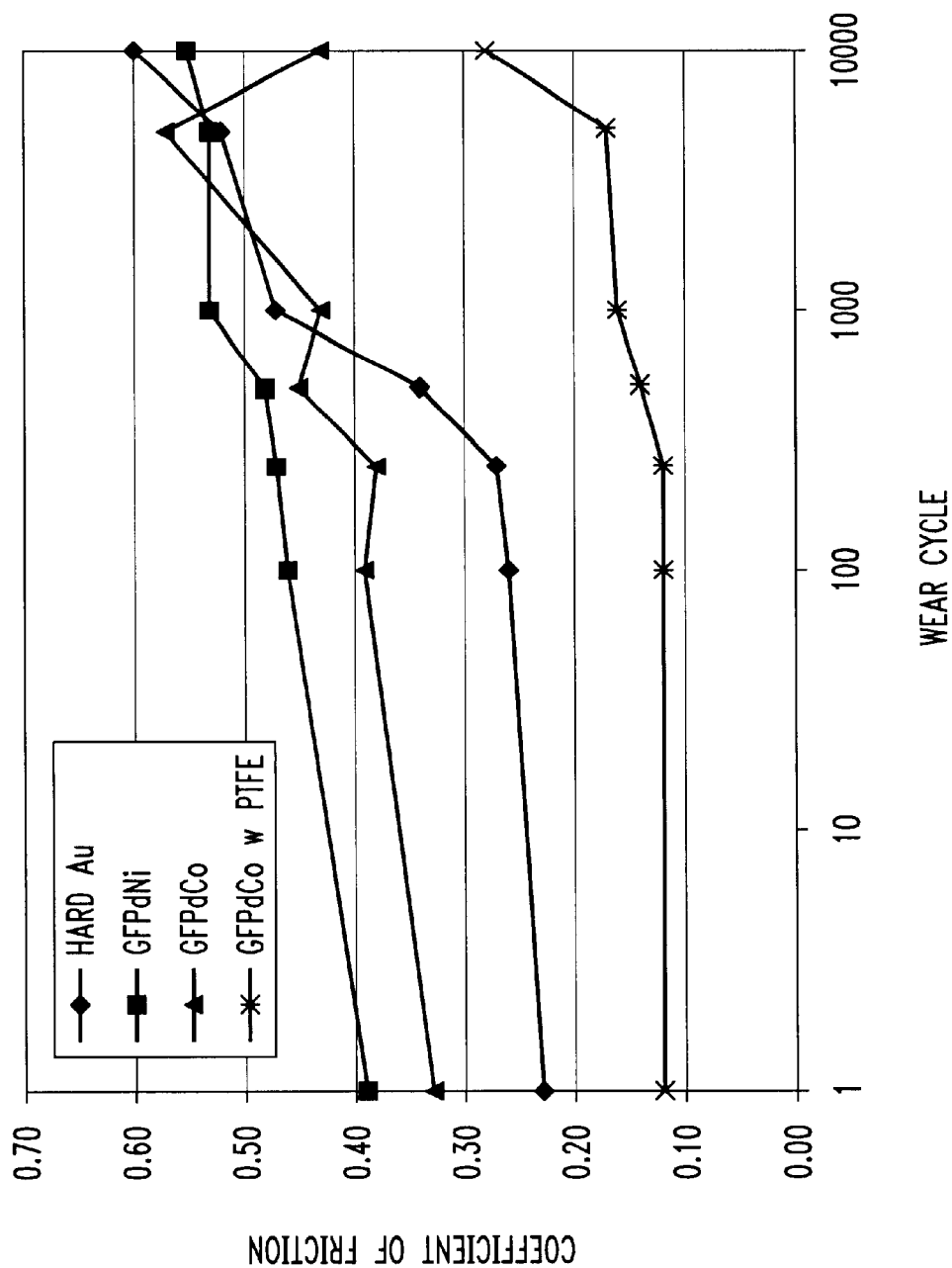

ELECTRODEPOSITED PRECIOUS METAL FINISHES HAVING WEAR RESISTANT PARTICLES THEREIN

BACKGROUND OF THE INVENTION

1. Field of the Invention

The present invention is directed to an electrodeposition process for depositing a composite plating comprising a precious metal having wear resistant particles therein and the resultant plated article. More particularly the invention is directed to an electroplated surface finish having wear resistant particles therein which is particularly useful as a surface finish for high reliability electronic connectors.

2. Description of the Related Art

The trend in today's electronic technology is for electronic connectors, e.g. connectors for integrated circuit devices to a printed circuit board, to keep getting smaller and have increasing numbers of contact elements. Consequently, the entry pressure when mating the contacts increases unless the spring forces are reduced. This can ultimately result in unwanted increased wear of the contacts as measured for example by either frictional forces or contact resistance as a function of wear cycles.

Composite plated coatings of various types are known in the plating field and other fields. For example, Henry et al., in U.S. Pat. Nos. 4,830,889 and Feldstein, in 5,721,055 describe the co-deposition of fluorinated polyethylene and nickel from an electroless nickel plating bath. Historically, electroless or auto catalytic plating has always been treated as a separate and distinct technology from that of electroplating, the latter requiring an electric current for deposition to take place. The plated articles as disclosed in Feldstein are textile spinning machinery parts. Henry et al. sets forth several general uses for such co-deposits. It should be noted that Henry et al. state that "fluorinated carbon has been co-deposited directly on the substrate surface in electroplating processes", however, no details or description of the process or the metals being deposited are given. Itoh et al., U.S. Pat. No. 5,103,637 is directed to a rocket engine combustion chamber with a surface comprising a metal matrix, such as nickel or copper alloys having heat resistant particles such as ceramic oxide particles dispersed therein. The surface is formed by electroplating. Further, Tsuchiya et al., U.S. Pat. No. 5,124,007 describes a composite electroplated nickel having particles such as silicon nitride, silicon carbide or tungsten carbide dispersed therein for use on piston rings.

SUMMARY OF THE INVENTION

A precious metal electroplating bath for plating a composite layer of the precious metal together with lubricating particles and the process of plating the composite is described.

The invention further includes an article of manufacture having an electroplated precious metal composite comprising the precious metal and lubricating particles dispersed therein, on the surface of the article.

The invention is particularly directed to a method and plating bath for coating the surface of an electrical connector having a conductive base metal and the resultant electronic connector to provide a connector having improved wear characteristics without significant loss of contact conductivity.

More particularly, the preferred process comprises the use of an electroplating bath having an anode and a cathode and comprising an aqueous solution of palladium ions and cobalt ions having a lubricating fluoropolymer dispersed therein. The article to be plated, such as an electronic connector, comprises a conductive base metal which is itself made or is in electrical contact with the cathode of the bath and is immersed in the plating bath. Plating is initiated by passing a current through the bath while the bath is agitated. The resultant deposit is a PdCo alloy having the fluoropolymer dispersed therein.

BRIEF DESCRIPTION OF THE DRAWINGS

FIG. 3 is a chart of the coefficient of friction of various precious metal finishes as a function of the number of wear cycles as measured by a sliding wear test.

FIG. 4 is a graphic representation of the chart shown in FIG. 3.

DETAILED DESCRIPTION OF THE INVENTION

Figure 1:
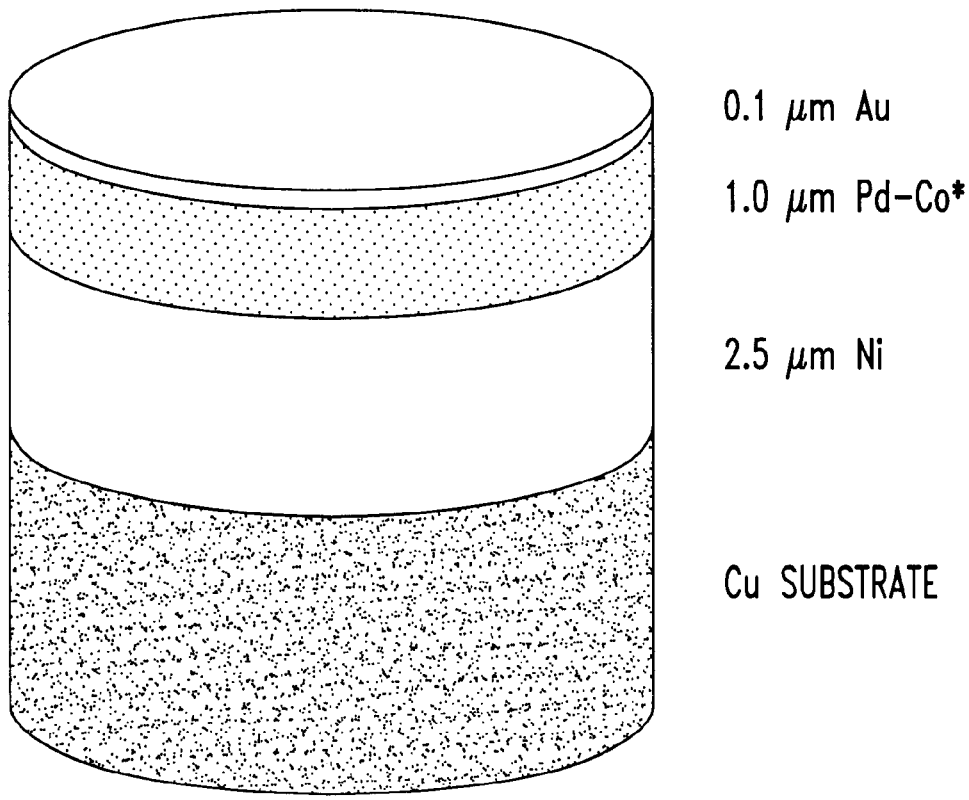
FIG. 1 is a schematic representation of an electrodeposited layer structure useful in a high reliability electrical connector and for measuring sliding wear.

Generally, modern electronic interconnects requiring high reliability connectors employ precious metal finishes to provide low electrical resistance and resistance to oxidation or other chemical degradation. If, instead of reducing the spring force, the entry force can be reduced such as by lowering the friction between mating parts, the spring force, and hence the reliability of the connection can be maintained. However, this must be accomplished without any significant increase in contact resistance. Alternatively, by increasing the wear resistance of the precious metal coating by providing hard particles dispersed therein, the reliability of the contact can be maintained.

We have now found that by co-depositing lubricating particles, such as fluorinated polyethylene with an electrodeposited precious metal layer, the entry force friction can be significantly reduced without any significant gain in contact resistance and with an increased wear resistance of the electrical connector. Similarly, if one co-deposits particles which are significantly harder than the precious metal layer, one can also increase the wear resistance of the contact. Consequently, for the purpose of this application, the term "wear resistant particles" shall include lubricating particles which reduce the coefficient of friction and hard particles which prevent or reduce frictional wear of the precious metal layer.

While the invention will be described in terms of the preferred embodiment for use as a surface finish for an electronic connector, it should be understood that the invention is not so limited. Hence, one can substitute other precious metal electroplating baths and/or other co-deposited particles for those set forth in the preferred embodiment. For example, one can substitute other known electroplating baths, e.g. commercially available Pd, Au, Pt or PdNi or other precious metal alloy baths for the PdCo plating bath described herein. Similarly, one can substitute other lubricating particles such as graphite, boron nitride (BN) or buckminsterfullerene ($C_{60}$), or other wear improving particles for the preferred polytetrafluoroethylene particles in any of the precious metal baths. Additionally, one can employ nitrides such as BN or AlN or carbides such as SiC, WC and the like or diamond to provide wear resistance as long as they do not cause a significant increase in contact resistance of the plated surface. Further, the resultant article of manufacture is not meant to be limited to electronic connectors, albeit this is a primary use due to the unexpected lack of a significant increase in contact resistance of the composite finish even when employing non-conductive particles.

The preferred plating bath of the invention is a sulfate bath comprising from about 35 to about 45 g/l of Pd, from about 6 to about 10 g/l of Co and from about 2 to about 5 ml/l of Dupont's PTFE 30, a fluoropolymer dispersion in water having polytetrafluoroethylene (PTFE) particles of from about 0.05 to about 0.5 $\mu$m in diameter in a concentration of about 60% by total weight. It should be understood that other concentrations of bath ingredients can be employed as well, and the invention is not meant to be limited to the use of a bath with the above stated composition.

Typical plating conditions for the preferred bath include a current density of from about 50 to about 700 ASF, a bath temperature of from about 45° C. to about 60° C. at a pH of from about 7 to about 7.5, with agitation of from about 0.25 to about 3 m/sec. The resultant deposit comprises a PdCo alloy containing 20–30 wt. % Co having the PTFE particles uniformly dispersed therein. However, PdCo alloys containing 5–35 wt. % Co are suitable. Typically, for electronic connectors, the substrate upon which plating occurs is bulk Cu which preferably has a Ni layer deposited thereon. A suitable thickness for the Ni layer is in the order of 2–3 $\mu$m, but may be more or less. However, it should be understood that the substrate need not be copper and could be any other conductive material. The thickness of the electroplated precious metal composite which overlies the nickel, when and if it is present, is typically in the order of about 1 $\mu$m, but may be more or less than this thickness Preferably, subsequent to electrodeposition, a thin flash coating of gold in the order of 0.1 $\mu$m thick is provided over the PdCo alloy—fluoropolymer composite layer.

While one may expect a reduction in surface friction with a coating having non-conductive lubricant particles therein as compared with a coating without such particles, one would also expect that the presence of such particles in an amount that would significantly reduce the friction, would also significantly increase the contact resistance of the surface making it unsuitable for use in an electrical connector. We have found that this is not the case.

In our recent article, "Palladium-Cobalt Makes a Superior Finish", *Cornnector Specifier*, pg. 12 et al., February 1999, which is incorporated herein by reference, we describe the PdCo system (without lubricant co-deposition) and compare it to PdNi and Hard-Au. In order to determine the long-term performance characteristics of the surface connector contacts, an important parameter is called sliding wear. The sliding wear test provides a measure of the hardness and lubricity of the electroplated finish. These are major factors, along with contact resistance, to be considered when designing high reliability electronic connectors.

Figure 2:
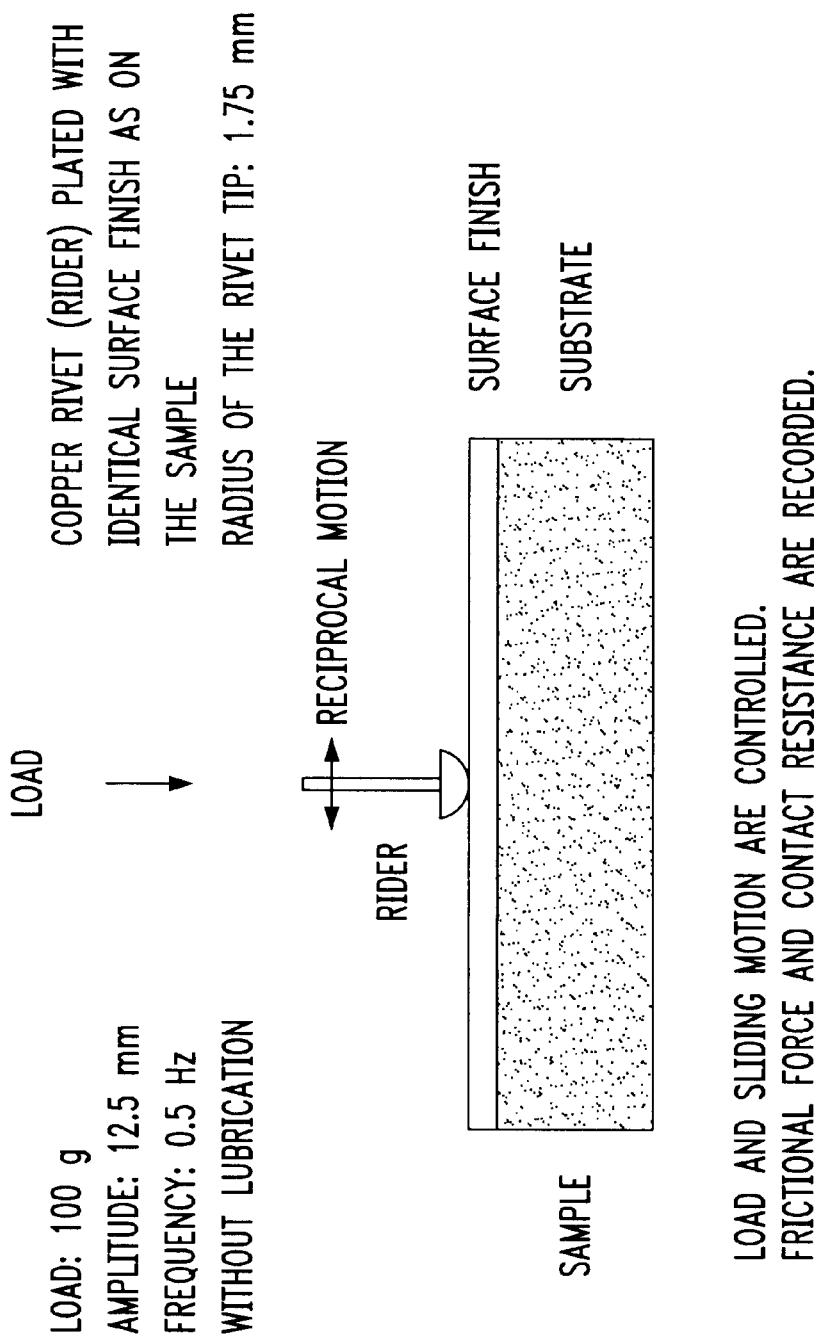
FIG. 2 is a schematic drawing of an apparatus useful for measuring wear and frictional forces on a surface.

The sliding wear was measured using a rider and flat apparatus as shown in FIG. 2. The rider is a rivet with a 1.75 mm radius and the flat was a 25 mm diameter disc, both fabricated from copper. Mated samples were plated with identical surface finishes. A load of 100 grams (about 1.0N) is applied to the rider, and reciprocal movement with a 12.5 mm amplitude is imposed at a rate of 30 cycles/min. (0.5 Hz).

A test sample for the sliding wear test, which sample depicts the layers one may find in a high reliability connector made in accordance with the present invention is shown with reference to FIG. 1. As shown, a Ni layer, typically about 2.5 $\mu$m thick is formed, such as by electrodeposition, on a copper substrate. The novel electrodeposited PdCo alloy having lubricating particles dispersed therein is formed over the Ni layer. The PdCo layer is typically about 1 $\mu$m thick. A 0.1 $\mu$m gold flash layer is then preferably formed over the composite layer.

The sliding wear performance is examined by measuring the friction force and contact resistance. The friction force is measured by a strain gauge, and the contact resistance was simultaneously determined employing a 25 mA current through the system while measuring the voltage drop.

Results of the sliding wear test, (FIGS. 3 and 4), have shown that the friction force of a precious metal finish can be considerably reduced by incorporating non-conductive lubricating particles into the finish during electroplating without significantly increasing the electrical contact resistance. A comparison of the coefficient of friction as measured by the sliding wear test as a function of wear cycles for various finishes is shown in FIG. 3. As can be seen from this Figure, the novel finish has the lowest coefficient of friction throughout the range of cycles tested. Further, the measured contact resistance during the 10,000 sliding wear cycles for the novel finish was only about 3–4 m$\Omega$.

It should be understood that applicants consider their invention to encompass any electrolytically co-deposited precious metal/lubricating or wear resistant particle surface finish for wear reduction, especially for use as a surface finish for the contact pins of electrical connectors.

What is claimed is:

1. An electrical connector comprising connector contacts, said contacts comprising a metal base and a surface finish layer over said base, said surface finish layer comprising a composite of an electroplated precious metal composition having wear resistant particles dispersed therein, wherein the precious metal composition is a PdCo alloy and the wear resistant particles comprise fluoropolymer particles.

2. The connector recited in claim 1 wherein said alloy contains from about 5 to about 35 wt. % Co.

3. The connector recited in claim 1 wherein the wear resistant particles comprise a fluoropolymer having a sub-micron mean particle size.

4. The connector recited in claim 1 further comprising a flash layer of Au over the electroplated composite layer.

5. An electrical connector comprising connector contacts, said contacts comprising a base metal, a thin layer of nickel thereover, and a thin layer of a PdCo alloy having polymeric fluorocarbon lubricating particles dispersed therein over said nickel layer.

6. The connector recited in claim 5 wherein the base metal is copper.

7. The connector recited in claim 5 further comprising a flash coat of gold over said PdCo layer.

8. The connector recited in claim 5 wherein the lubricating particles are sub-micron sized polytetrafluoroethylene particles.

9. An article of manufacture comprising an electroplated wear resistant surface finish over a base metal, said surface finish comprising a layer of a precious metal composition have wear resistant particles dispensed therein, wherein the precious metal composition is a PdCo alloy and the particles are fluorocarbon polymers.

10. The article recited in claim 9 further including a thin layer of nickel between the base metal and the precious metal composition.

11. The article recited in claim 10 further including a gold flash layer over the precious metal composition.

12. An electroplating bath for depositing a composite layer of a PdCo alloy having wear resistant particles dispersed therein comprising an aqueous sulfate solution of palladium and cobalt having dispersed therein sub-micron sized wear resistant particles of fluorocarbon polymer.

13. The electroplating bath recited in claim 12 wherein the concentration of palladium ions in the bath is from about 35 to about 45 g/l, the concentration of cobalt ions in the bath is from about 6 to about 10 g/l and the pH of the bath is from about 7 to about 7.5.

14. A method of forming a wear resistant surface on an article having an exposed metal surface comprising placing said article in an electroplating bath comprising an aqueous solution of a precious metal, said solution having dispersed therein sub-micron sized wear resistant particles, making or contacting the exposed metal surface of the article with a plating bath cathode and passing a current at an appropriate voltage between an anode of the bath and the cathode so as to co-deposit the precious metal and wear resistant particles, wherein the aqueous solution of precious metal comprises an aqueous sulfate solution of palladium and cobalt and the wear resistant particles comprise sub-micron sized particles of fluorocarbon polymer.

15. The method recited in claim 14 wherein the particles are polytetrafluoroethylene.

* * * * *